US009514824B2

(12) United States Patent
Lin et al.

(10) Patent No.: US 9,514,824 B2
(45) Date of Patent: *Dec. 6, 2016

(54) PARTIAL LOCAL SELF BOOSTING FOR NAND

(71) Applicant: Cypress Semiconductor Corporation, San Jose, CA (US)

(72) Inventors: Ya-Fen Lin, Saratoga, CA (US); Colin S. Bill, Cupertino, CA (US); Takao Akaogi, Cupertino, CA (US); Youseok Suh, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 84 days.

This patent is subject to a terminal disclaimer.

(21) Appl. No.: 14/132,430

(22) Filed: Dec. 18, 2013

(65) Prior Publication Data

US 2014/0104957 A1 Apr. 17, 2014

Related U.S. Application Data

(63) Continuation of application No. 12/783,351, filed on May 19, 2010, now Pat. No. 8,638,609.

(51) Int. Cl.
G11C 16/10 (2006.01)
G11C 16/12 (2006.01)
G11C 16/04 (2006.01)
G11C 16/34 (2006.01)

(52) U.S. Cl.
CPC ........... *G11C 16/12* (2013.01); *G11C 16/0483* (2013.01); *G11C 16/10* (2013.01); *G11C 16/3418* (2013.01)

(58) Field of Classification Search
CPC ..... G11C 16/0483; G11C 16/10; G11C 16/12; G11C 16/3418
See application file for complete search history.

(56) References Cited

U.S. PATENT DOCUMENTS

| 5,621,684 | A | 4/1997 | Jung |
| 5,991,202 | A | 11/1999 | Derhacobian et al. |
| 6,314,026 | B1 | 11/2001 | Satoh et al. |
| 6,469,933 | B2 | 10/2002 | Choi et al. |
| 6,859,397 | B2 | 2/2005 | Lutze et al. |
| 6,973,003 | B1 | 12/2005 | Salleh et al. |

(Continued)

OTHER PUBLICATIONS

Spansion, "New Flash Memory Tech Challenges Floating Gate," EE Times-Asia, May 16-31, 2007, pp. 1-2.

(Continued)

*Primary Examiner* — Khamdan Alrobaie

(57) ABSTRACT

A memory system is programmed with minimal program disturb and reduced junction and channel leakage during self-boosting. Pre-charging bias signals are applied to word lines adjacent to a selected word line before a program signal is applied to the selected word line and a pass signal is applied to the remaining word lines. The pre-charging bias signals apply a pre-charge to the memory cells. The pre-charging bias signals are chosen to improve the isolation of the memory cells on word lines adjacent to the selected word line, improve self boost efficiency and reduce current leakage to prevent or reduce program disturb and/or programming errors especially in the inhibited memory cells on the selected word line.

16 Claims, 14 Drawing Sheets

(56) References Cited

U.S. PATENT DOCUMENTS

| | | |
|---|---|---|
| 6,975,537 B2 | 12/2005 | Lutze et al. |
| 7,023,733 B2 | 4/2006 | Guterman et al. |
| 2005/0117399 A1 | 6/2005 | Kwon et al. |
| 2006/0250850 A1 | 11/2006 | Lee |
| 2007/0279986 A1 | 12/2007 | Yaegashi et al. |
| 2009/0147569 A1* | 6/2009 | Kim .................. 365/185.02 |
| 2009/0168533 A1* | 7/2009 | Park et al. .......... 365/185.17 |
| 2011/0194351 A1 | 8/2011 | Kim et al. |
| 2011/0299331 A1 | 12/2011 | Kim |

OTHER PUBLICATIONS

Definition of Word "FOR," Free Merriam-Webster Dictionary, www.merriam-webster.com, Aug. 3, 2012, pp. 1-3.

Definition of Word "FOR," Dictionary.com, dictionary.reference.com, Oct. 3, 2012, pp. 1-3.

Definition of Word "FOR," Free Online Dictionary, www.thefreedictionary.com, Oct. 3, 2012, pp. 1-2.

USPTO Advisory Action for U.S. Appl. No. 12/783,351 dated Oct. 10, 2012; 3 pages.

USPTO Final Rejection for U.S. Appl. No. 12/783,351 dated Jul. 18, 2012; 11 pages.

USPTO Non-Final Rejection for U.S. Appl. No. 12/783,351 dated Feb. 1, 2012; 13 pages.

USPTO Notice of Allowance for U.S. Appl. No. 12/783,351 dated Oct. 2, 2013; 10 pages.

\* cited by examiner

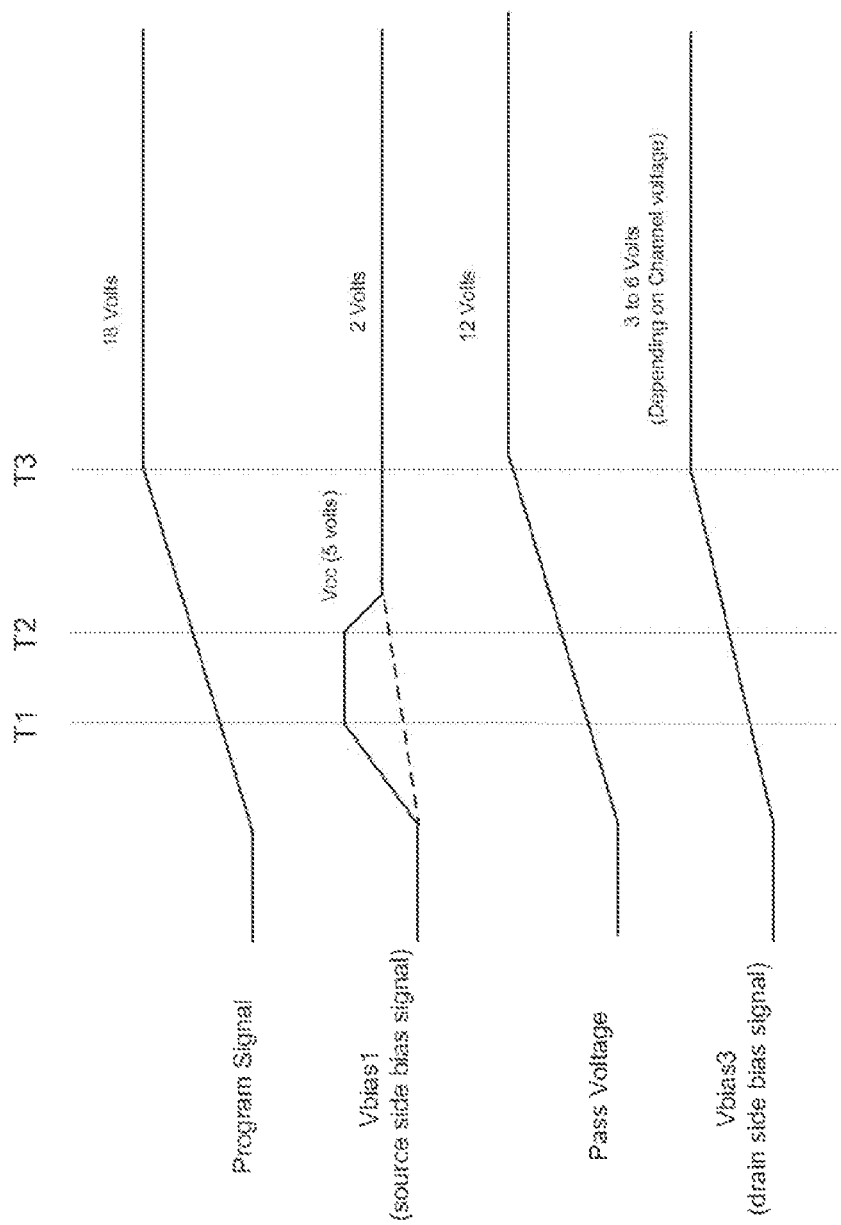

PARTIAL LOCAL SELF BOOSTING FOR NAND

CROSS-REFERENCE TO RELATED APPLICATIONS

This application is a Continuation of and claims priority to U.S. patent application Ser. No. 12/783,351, filed on May 19, 2010, which is hereby incorporated by reference in its entirety.

TECHNICAL FIELD

The present disclosure relates to programming a non-volatile semiconductor memory device, and more particularly to programming a flash memory having a NAND-type architecture which utilizes a self-boosting technique to aid programming.

BACKGROUND

The statements in this section merely provide background information related to the present disclosure and may not constitute prior art.

Semiconductor memory devices have increasingly been used in a wide variety of electronic devices. Non-volatile semiconductor memory devices are now seen in cellular phones, personal digital assistants, digital cameras, audio recorders, digital video camcorders, and USB flash drives, just to name a few. Electrical Erasable Programmable Read Only Memory (EEPROM) and flash memory devices are among the most popular non-volatile semiconductor memories.

FIG. 1 illustrates a typical memory cell utilizing a floating gate 100 that is positioned above and insulated from a channel region 102 in the semiconductor substrate 104. The floating gate 100 is positioned between source 106 and drain regions 108. A control gate 110 is placed over and insulated from the floating gate 100. The threshold voltage of the transistor is controlled by the amount of charge that is retained on its floating gate 100. That is, the minimum amount of voltage that must be applied to the control gate 110 before the transistor is turned on to permit conduction between its source 106 and drain 108, and thereby forming a channel 102 on the surface portion of the semiconductor substrate 104 immediately beneath the floating gate 100, is controlled by the level of charge on the floating gate 100.

FIG. 2 illustrates a typical two-dimensional array of floating gate memory transistors, or memory cells 210, formed on a semiconductor substrate. FIG. 2 includes several strings, known as NAND strings NS, of floating gate memory transistors 210. Each transistor 210 is coupled to the next transistor 210 in the string by coupling the source of one transistor to the drain of the next to form bit lines BL1-BLn. Each NAND string NS includes a select transistor 212, 214 on either end of the string NS of memory cells. The drain side select transistor 212 connects the NAND strings NS to respective bit lines and the source side select transistor 214 connects the NAND strings NS to a common source line 216. A plurality of word lines WL1-WLn, run perpendicular to the NAND strings NS. Each word line connects to the control gate 218 of one memory cell 210 of each NAND string NS.

Before programming a flash memory device, its memory cells are typically erased and have a certain threshold voltage, such as −2 volts. Memory cells may be erased as part of a batch erase where all the memory cells existing on the memory cell array are simultaneously erased, or as part of a block erase, where a block consists of a group of NAND cells arranged in row direction and sharing a common word line. Other methods exist which are well known in the art. For a memory cell erasure, the control gates are set to ground through their word lines, while a high voltage (e.g. 20 V) is applied to control gates through the word lines in non-selected blocks. The bit lines and source lines are turned into a floating state respectively and a high voltage (e.g. 20 V) is applied to the semiconductor substrate. By doing so, electrons are discharged into the semiconductor substrate from the floating gates of the selected memory cells and the threshold voltages of the selected memory cells are shifted in the negative direction.

When programming a flash memory device, a program voltage is typically applied to the control gate of the memory cell and its bit line is grounded. Electrons from the substrate channel are injected into the floating gate through a process known as tunneling. When electrons accumulate on the floating gate, the floating gate becomes negatively charged and the threshold voltage of the memory cell is raised so that the memory cell is in the programmed state. In the case of NAND type memory, the threshold voltages after data erase are normally "negative" and defined as "1." The threshold voltages after data write are normally "positive" and defined as "0."

When storing one bit of digital data, the range of possible threshold voltages of the memory cell is divided into two ranges which are assigned logical data "1" and "0." In one example of a NAND type flash memory, the voltage threshold is negative after the memory cell is erased, and defined as logic "1." The threshold voltage after a program operation is positive and defined as logic "0."

When the threshold voltage is negative and a read is attempted, the memory cell will turn on indicating logic "1" was stored. When the threshold voltage is positive and a read operation is attempted, the memory cell will not turn on, indicating logic "0" was stored. A memory cell can also store multiple bits of digital data, such as in Multi-Level Cell Architecture devices (MLC devices). The range of possible threshold values determines the number of possible levels of data. For example, if four levels of information are stored, there will be four threshold voltage ranges assigned to the data values "11", "10", "01", and "00." In one example of a NAND type memory, the threshold voltage after an erasure is negative and defined as "11." Positive threshold voltages may be used for the states of "10", "01", and "00."

When a memory cell is programmed, all of the memory cells on the same word line also receive the program signal. Even though the bit lines on their NAND strings are set to a supply voltage Vcc (e.g. 3-5 V), and inhibited, it is still possible for another memory cell on the same word line to be inadvertently programmed. In particular, the memory cell adjacent to the memory cell selected for programming may be especially vulnerable.

FIG. 2 shows the memory cell to be programmed S on word line WL3 along with the inhibited memory cells Q on the same word line WL3. The selected bit line BL1 is set to ground and the inhibited bit lines BL2-BLn are set to Vcc. The program signal Vpgm is applied to the selected word line WL3 and is in turn applied to the control gates 218 of the memory cells 210 along the word line WL3. This places the program signal Vpgm on memory cells 210 in both selected BL1 and unselected BL2-BLn bit lines. The unintentional programming of an unselected memory cell Q on the selected word line WL3 is called "program disturb."

There have been many attempts to limit or prevent program disturb. Conventional self boosting is a method whereby the unselected bit lines are electrically isolated and a pass voltage is applied to the unselected word lines during programming. FIG. 3 illustrates conventional self boosting. A supply voltage Vcc (e.g. 3-5 V) is applied to both the drain 302 and control gate 304 of the unselected drain side select transistors 310 to turn the drain side select transistors 212 off, and thereby electrically isolate the unselected bit lines. A pass voltage Vpass (e.g. 10 V) is applied to the unselected word lines WL1, WL2 & WL4-WLn. The unselected word lines WL1, WL2 & WL4-WLn capacitively couple to the unselected bit lines BL2-BLn, causing a voltage (such as about 6 volts), to exist in the channel of the unselected bit lines BL2-BLn, which tends to reduce program disturb. Self boosting reduces the potential difference between channels of the unselected bit lines BL2-BLn and the program signal Vpgm that is applied to the selected word line WL3. The end result is reduced voltage across the tunnel oxide and therefore reduced program disturb, especially in the memory cells Q in the unselected bit lines BL2-BLn on the selected word line WL3.

Conventional self boosting does have its disadvantages however. A NAND string is typically programmed from the source side to the drain side. When all but the last few memory cells have been programmed, if all or most of the memory cells on the NAND string NS being inhibited were programmed, then there is negative charge in the floating gates of the previously programmed cells. Because of this negative charge on the floating gates, the boosting potential doesn't get high enough and there may still be program disturb on the last few word lines. For example, when programming one particular memory cell S, if a memory cells B on the source side word line and adjacent to inhibited memory cells Q on the selected word line were already programmed, the negative charge on their floating gates will limit the boosting level of the self boosting process and possibly cause program disturb on the memory cell Q adjacent to the programmed memory cell S.

In addition, conventional self boosting also suffers from uneven channel voltage. In conventional self boosting, channel voltage is not uniformly distributed if any cell in the string is programmed. Channel voltage on the drain side, with pre-charging, is higher than the source side. That is, memory cells on the source side are vulnerable to program disturbs. In other words, there is non-uniform channel voltage: the voltage is different through the channel. The differences in channel voltage on either side of the programmed memory cell may continue to grow as more memory cells are programmed. Further, there is pattern dependent channel voltage, such that channel voltage is different from bit line to bit line due to their varying programming/erasure patterns. The channel voltage is boosted in different amounts depending on the threshold voltages of the cells. As a result, when data is written into the selected memory cell in the selected NAND string, the stress due to the programming voltage applied to all the memory cells on the word line may cause a disturbance in the previously programmed memory cells.

Local Self Boosting ("LSB") and Erased Area Self Boosting ("EASB") are two schemes created to help deal with the disadvantages inherent in conventional self boosting methods.

T. S. Jung et al. proposed a local self boosting ("LSB") technique in "A 3.3V 128 Mb Multi-Level NAND Flash Memory for Mass Storage Applications," ISSCC96, Session 2, Flash Memory, Paper TP 2.1, IEEE, pp. 32. The system reduces the program voltage stress that causes program disturb and in particular the variance of threshold voltages of memory systems utilizing the Multi-Level Cell architecture (MLC device).

In the LSB system illustrated in FIGS. 4A and 4B, the bit line BL1 of the memory cell S being programmed is at 0 volts and the bit lines BL2-BLn of memory cells Q to be inhibited are at a supply voltage (e.g. 3-5 V). A program signal Vpgm (e.g. 20 volts) is applied to the selected word line WL3. The word lines WL2, WL4 adjacent to the selected word line WL3 are at 0 volts. A pass voltage Vpass (e.g. 8-12 volts) is applied to the remaining, unselected word lines WL1, WL5-WLn.

In the LSB method, when applying a programming voltage to the selected word line WL3, in order to reduce or prevent program disturb in memory cells 210 on the other inhibited NAND strings INS, 0 volts are applied to the word lines WL2, WL4 on either side of the selected word line WL3, so that the two memory cells above A and below B the inhibited memory cell Q are "turned off." With the adjacent memory cells "turned off," the channel voltage of the inhibited cell Q will not be influenced by the self-boosting in the channels of the adjacent memory cells A, B. With the program signal Vpgm applied to the selected word line WL3, the channel of the inhibited memory cell Q may be locally self boosted to a voltage level that is higher than could be reached when the inhibited memory cell's channel region is influenced by the self boosting of the other memory cells in the same inhibited NAND string INS. The result is prevented or reduced incidents of program disturb.

Care must taken when selecting an appropriate pass voltage level. For the LSB method to work, the memory cells adjacent to the inhibited memory cell must be turned off regardless of the data stored. These adjacent memory cells can have arbitrary threshold voltage levels of either a positive or negative threshold voltage. To "shut off" these adjacent memory cells by means of the back-bias effect caused by the channel voltage, the pass voltage must be at a level able to sufficiently increase the lowest threshold voltage likely seen. However, the pass voltage must not be set too high. As the pass voltage increases, the variation in threshold voltage increases as well. A threshold voltage may be increased or decreased enough to change its programmed logic state. In other words, if pass voltage is too low, self boosting in the channels will be insufficient to prevent program disturb, but if pass voltage is too high, unselected word lines may be reprogrammed.

Tanaka et al. proposed an Erased Area Self-Boosting (EASB) system, U.S. Pat. No. 6,525,964, to deal with some of the disadvantages of conventional LSB.

The EASB scheme may be applied to the conventional memory cell array that uses NAND strings and word lines, wherein the word lines are attached to one memory cell from each NAND string in the row. As illustrated in FIG. 5, to program a specific memory cell S, a program signal Vpgm (e.g. 20 volts) is applied to the word line WL3 connected to the control gate of the specific memory cell S. The word line WL4 adjacent to the selected word line WL3 on the source side is set to a level below the programming signal, such as 0 volts. A pass voltage Vpass (e.g. 8-12 volts) is applied to all the remaining word lines WL1-WL2, WL4-WLn. The pass voltage Vpass is selected to be below the level of the program signal Vpgm, but above the voltage level of the signal applied to the adjacent, source side word line WL4.

EASB may result in more uniform channel voltage and is less vulnerable to leakage, but the inhibited memory cell's Q channel voltage is lower than when using the LSB scheme. However, there is less junction leakage. The boosting ratio is also higher using EASB over LSB, which results in a higher channel voltage from self boosting for a given pass voltage.

The EASB scheme is also affected by whether the source side adjacent memory cell B has been programmed or erased, as the state of the source side adjacent memory cell B will influence the channel voltage of the inhibited memory cell Q. If the adjacent source side memory cell B is programmed, there is a negative charge on its floating gate, and the threshold voltage of the memory cell B will likely be positive. Zero volts are applied to its control gate. This results in a highly reverse biased junction under the negatively charged floating gate which can result in Gate Induced Drain Leakage (GIDL). GIDL involves electrons leaking into the self boosted channel. GIDL occurs when there is a large bias in the junction and a low or negative floating gate voltage. This is the case when the source side adjacent memory cell B is already programmed and the drain junction is boosted. GIDL will cause the self boosted voltage to leak away prematurely, resulting in a programming error. If the current leakage is high enough, the self boosted voltage level in the channel will drop with an increased risk for program disturb. In addition, the closer the selected word line WL3 is to the drain side select transistor 212, the less charge there will be in the boosted junction. Thus, the voltage in the self boosted junction will drop quicker, increasing the risk for program disturb.

If the adjacent source side memory cell B is erased, then there is a positive charge on the floating gate and the threshold voltage of the transistor B will likely be negative. The memory cell B may not even turn off when 0 volts is applied to its word line. And if the memory cell B is still on, the inhibited NAND string INS is not operating in EASB mode, but rather in the previously discussed conventional LSB mode. This is most likely to happen when other memory cells on the source side word lines are already WL4-WLn are already programmed, which tends to limit source side self boosting.

Lutze et al. proposed an Erased Area Self Boosting (EASB) system with pre-charging, U.S. Pat. No. 6,975,537, to deal with some of the limitations of LSB and EASB for programming a conventional memory array.

The EASB scheme proposed by Lutze may be applied to the conventional memory cell array that uses NAND strings and word lines, wherein the word lines are attached to one memory cell from each NAND string in the row. This EASB scheme is illustrated in FIG. 6. Before the program signal Vpgm (e.g. 18-20 volts) is applied to the word line WL3 of the selected memory cell S, the channel voltage of the source side of the inhibited NAND string SNS is first increased. If the adjacent source side memory cell B has been programmed, then raising the source side channel voltage of the inhibited NAND string SNS reduces GIDL. If the adjacent source side memory cell B has been erased, then raising the source side channel voltage of the inhibited NAND string SNS helps keep the adjacent source side memory cell B from "turning on."

The step of pre-charging the source side channel voltage of the inhibited NAND string SNS includes applying a pre-charge voltage Vpc to the adjacent source side word line WL4 and to at least one more of the other source side word lines. Application of the pre-charge voltage Vpc is commenced prior to applying a pass voltage Vpass (e.g. 10 V). The end result will be a source side channel voltage higher than from just applying the pass voltage Vpass alone.

A supply voltage, or Vcc, (e.g. 3-5 volts) is applied to the drain region and to the control gate of the drain side select transistor 212 connected to the bit line BL2-BLn containing the cell Q to be inhibited. The supply voltage Vcc is also applied to the source line 216 connected to the source side select transistor 214, but the source side select transistor control gate remains at 0 volts. The pre-charge voltage Vpc (e.g. 4 volts) is now applied to the adjacent source side word line WL4 as well as at least one other source side word line WL5. By applying the pre-charge voltage Vpc to the unselected source side word lines WL4-WL5, the source side channel voltage SNS is boosted to a voltage of Vcc-Vt, where Vt is the threshold voltage of the drain side select transistor 212. The drain side channel voltage is at Vcc-Vt. After the pre-charge phase is completed, the programming phase begins as illustrated in FIG. 7. A program signal Vpgm (e.g. 20 volts) is applied to the selected word line WL3, while a pass voltage Vpass (e.g. 8-12 V) is applied to the unselected word lines WL1-WL2 on the drain side of the selected word line WL3 (originally they were at 0 V). The pass voltage Vpass is also applied to the unselected word lines WL5-WLn on the source side except for the adjacent source side word line WL4. The drain region and control gate of the drain side select transistor 212 are both held at Vcc. Meanwhile, the word line WL4 connected to the adjacent source side memory cell B is lowered to 0 volts.

Hemink proposed a buffered bias with EASB or LSB, U.S. Pat. No. 7,161,833, attempting to improve on the LSB and EASB programming schemes. These alternative LSB and EASB schemes with buffered biasing may be applied to the conventional memory cell array that uses NAND strings and word lines, wherein the word lines are attached to one memory cell from each NAND string in the row.

The scheme according to Hemink proposed applying a biasing voltage Vpb ranging from 0 volts to some small positive voltage (e.g. 1-3 V) below the level of a pass voltage Vpass (e.g. 8-12 V) to two or more word lines (preferably adjacent) on the source side of the selected word line (for the EASB scheme). The same biasing voltage could be applied to one or more word lines (preferably adjacent) on the drain side of the selected word line as well as the source side of the selected word line (for the LSB scheme). The above described scheme should result in reduced incidents of current leakage, especially junction leakage and a reduction of programming errors and program disturb.

An embodiment of the modified EASB scheme is illustrated in FIG. 8. Two word lines WL4, WL5 (preferably adjacent) on the source side of the selected word line WL3 were grounded. The pass voltage Vpass was applied to all of the word lines WL1, WL2 on the drain side. Optionally, two or more word lines on the source side may be grounded, and may be separated from the selected word line WL3 by one or more word lines. The modified EASB scheme increases the channel length of the isolation region, helping to further reduce program disturb.

Current Leakage and particularly junction leakage may still occur between the grounded memory cells and the memory cells being programmed, and between the grounded memory cells and the memory cells to which the pass voltage has been applied. To further improve programming, rather than grounding the two word lines WL4, WL5 on the source side of the selected word line WL3, a low positive voltage Vpb may be applied instead (e.g. 1-3 V). This small voltage Vpb applied to the source side word lines WL4, WL5 suppresses current leakage while remaining adequate enough to isolate the two boosted regions in the EASB scheme.

The same buffered bias scheme may also be applied to conventional LSB. As illustrated in FIG. 9, two or more word lines (preferably adjacent) on both the source side and drain side of the selected word line WL3 are biased. Zero or low positive voltage levels Vpb (e.g. 1-3 V) are applied as desired to further reduce current leakage, program disturb, and/or altered threshold voltage levels.

SUMMARY

This Summary is provided to introduce a selection of concepts in a simplified form that is further described below in the Detailed Description. This Summary is not intended to identify key features or essential features of the claimed subject matter, nor is it intended to be used to limit the scope of the claimed subject matter.

Embodiments of the present invention are directed to a memory system which includes a self-boosting mode with reduced stress from a program signal, eliminated or reduced current leakage and improved isolation of the memory cells on the word lines adjacent to the selected word line.

One embodiment of the present invention provides a memory system having a plurality of strings of memory transistors, each string making up a bit line, arranged in parallel to form an array with a plurality of word lines, with each word line connecting across the bit lines to one of the memory transistors in each of the bit lines in the array. A Program Signal is selectively applied to one of the word lines ("selected word line") connected to a memory transistor that is to be programmed. Further, the Program Signal will not be applied to the selected word line until after a first predetermined time. A first Bias Signal is applied to a first word line and a second Bias Signal is applied to a second word line, the first and second word lines adjacent to each other, and the first word line adjacent to the source side of the selected word line, wherein the second Bias Signal is set to ground, and the first Bias Signal is elevated to a first predetermined voltage before the first predetermined time. A third Bias Signal is applied to at least one word line on the drain side of, and adjacent to, the selected word line. The third Bias Signal is elevated to a second predetermined voltage before the first predetermined time. A Pass Signal of a predetermined voltage is selectively applied to all of the remaining word lines that do not have a Bias or Program Signal applied.

Another aspect of the present invention is a memory system where the first Bias Signal is elevated to a third predetermined voltage before a second predetermined time, and the third Bias Signal is elevated to a fourth predetermined voltage before the second predetermined time. After a third predetermined time, the first Bias Signal is reduced to the first predetermined voltage, and the third Bias Signal is reduced to a fifth predetermined voltage. The first Bias Signal is reduced to the first predetermined voltage before the first predetermined time and the third Bias Signal is reduced to the fifth predetermined voltage before the first predetermined time.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 13 is a schematic diagram of a NAND flash memory system according to the present invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, and components, have not been described in detail as not to unnecessarily obscure aspects and features of the subject matter.

The present invention utilizes both conventional LSB and EASB schemes, allowing a boosting scheme to meet the individual needs of a specific semiconductor flash memory device. Further, the present invention improves on the above methods and reduces or eliminates their disadvantages through further reduced current leakage, and reduced pass voltage requirements due to improved boosting efficiency, resulting in a further reduction in program disturb and reduced risk of programming error.

The present invention incorporates pre-charging bias voltages that are selectively applied to the word lines on either side of the selected word line (drain side as well as source side word lines). Pre-charging bias signals are used to pre-charge memory cell channels. The bias signal applied to the non-selected word lines may be reduced to a lower voltage level before a programming operation is begun. This invention proposes several improved self-boosting schemes that increase the channel voltage of inhibited memory cells by pre-charging the inhibited memory cells.

Figure 1:
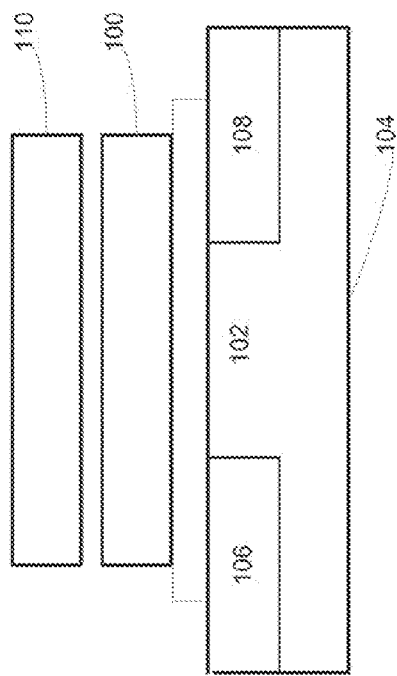
FIG. 1 is a cross-sectional view of a floating gate memory cell.
Figure 2:
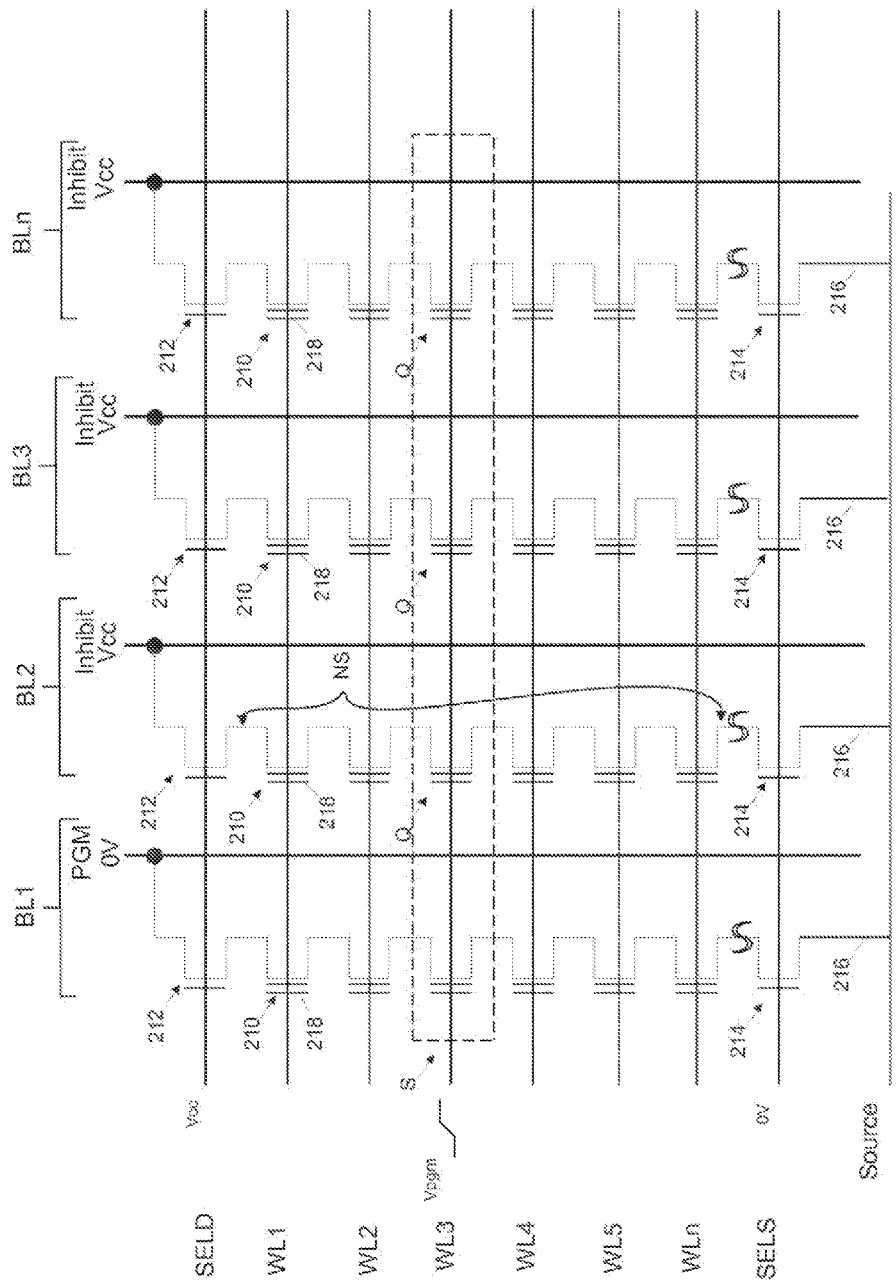
FIG. 2 is a schematic diagram of a NAND flash memory system.
Figure 3:
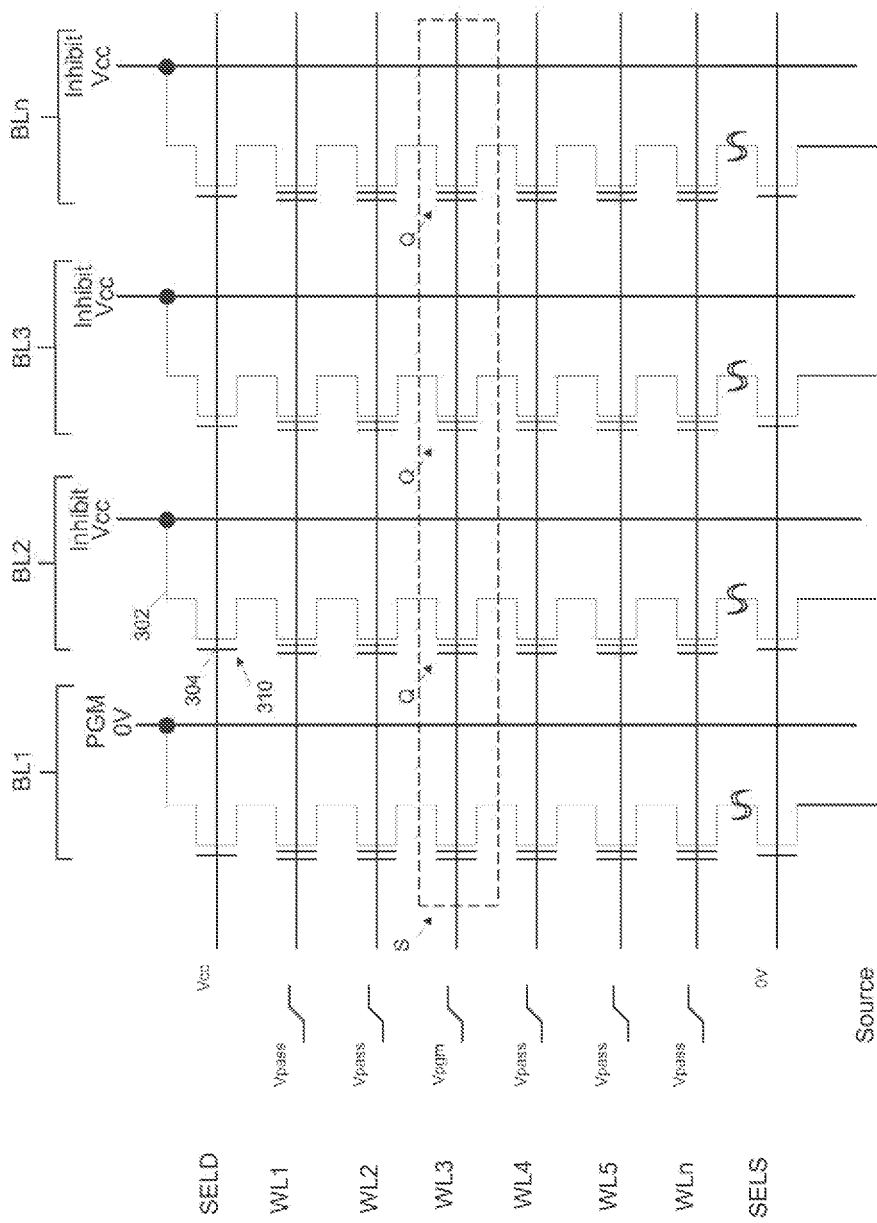
FIG. 3 is a schematic diagram of a NAND flash memory system.
Figure 4A:
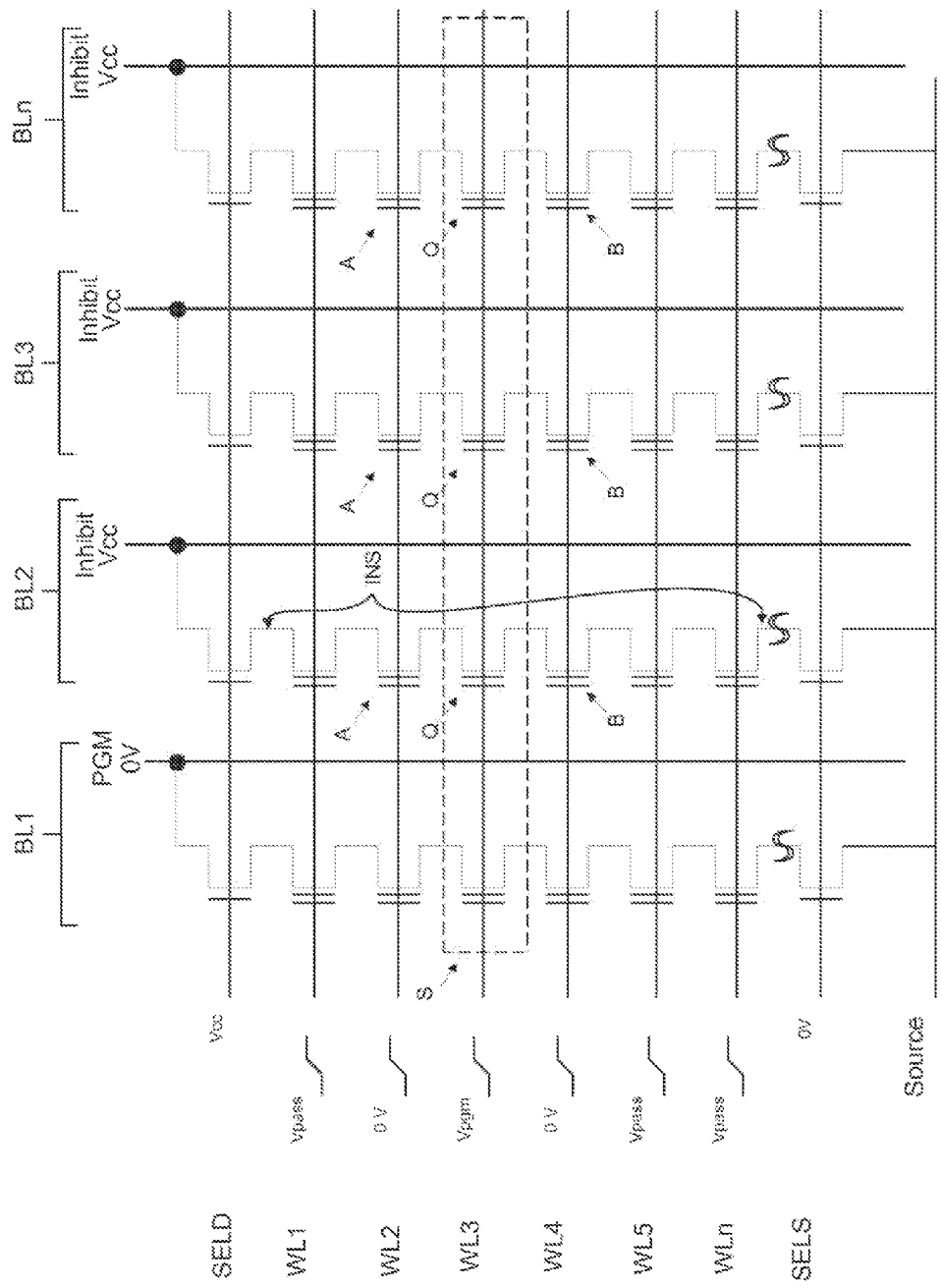
FIG. 4A is a schematic diagram of a NAND flash memory system.
Figure 4B:
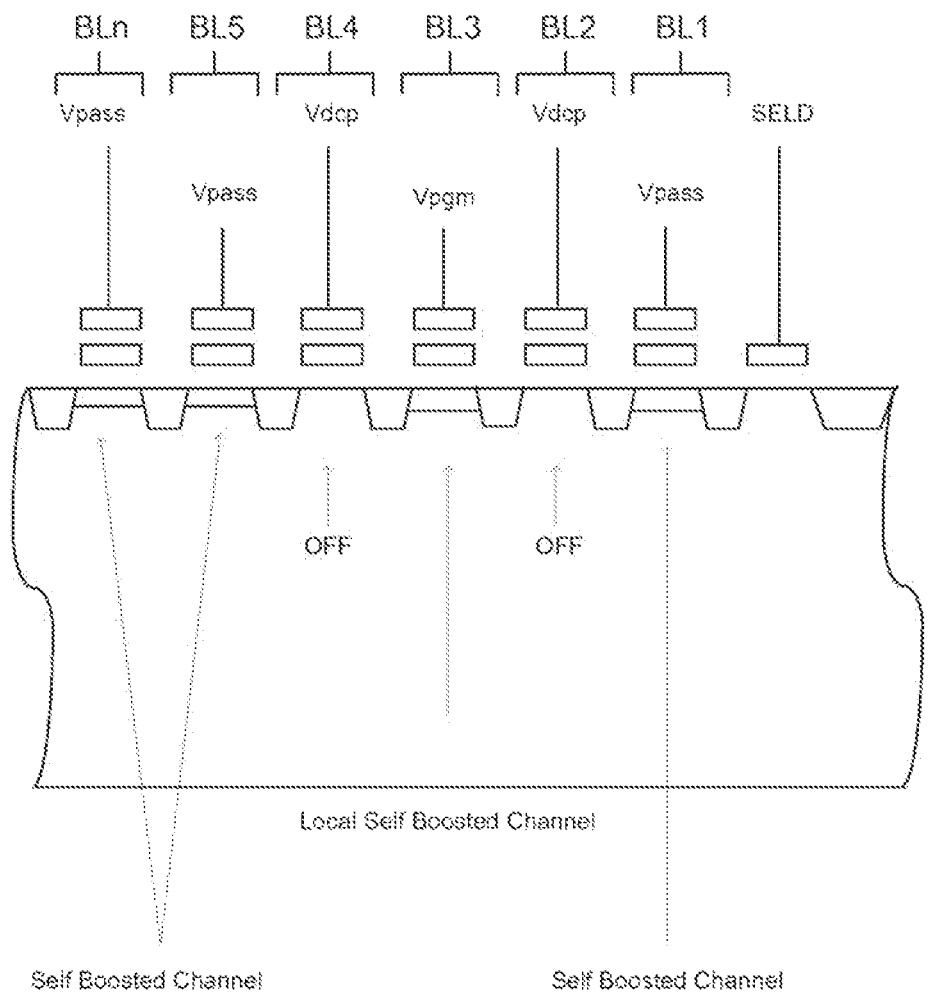
FIG. 4B is a cross-sectional view of a portion of a NAND flash memory system.
Figure 5:
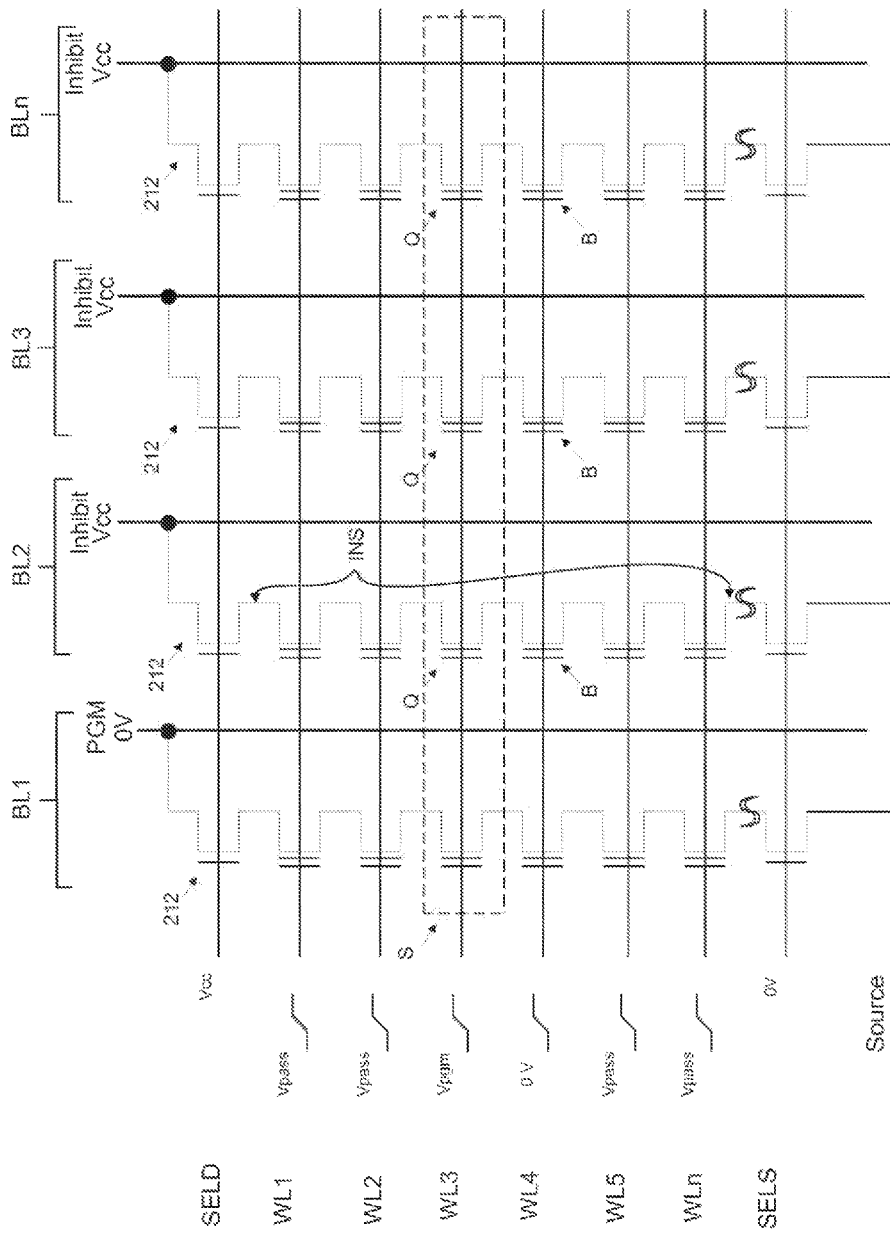
FIG. 5 is a schematic diagram of a NAND flash memory system.
Figure 6:
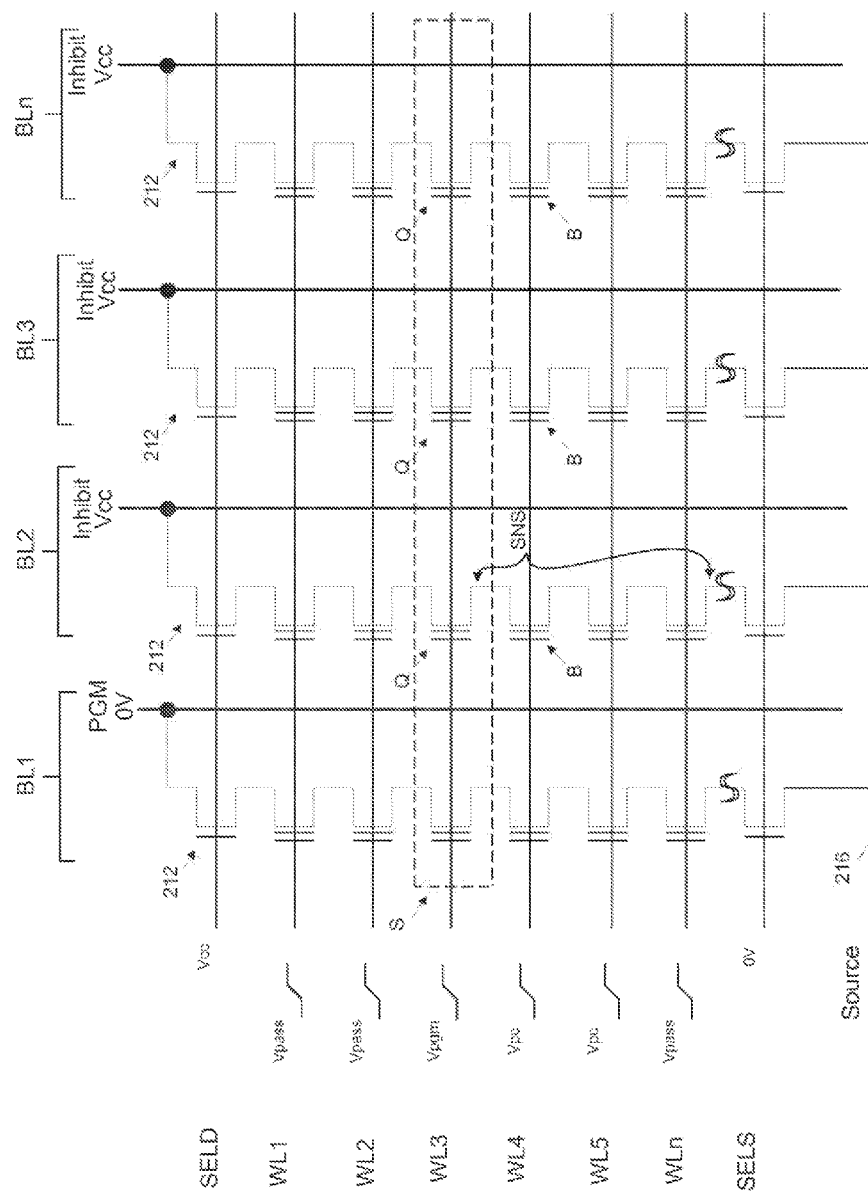
FIG. 6 is a schematic diagram of a NAND flash memory system.
Figure 7:
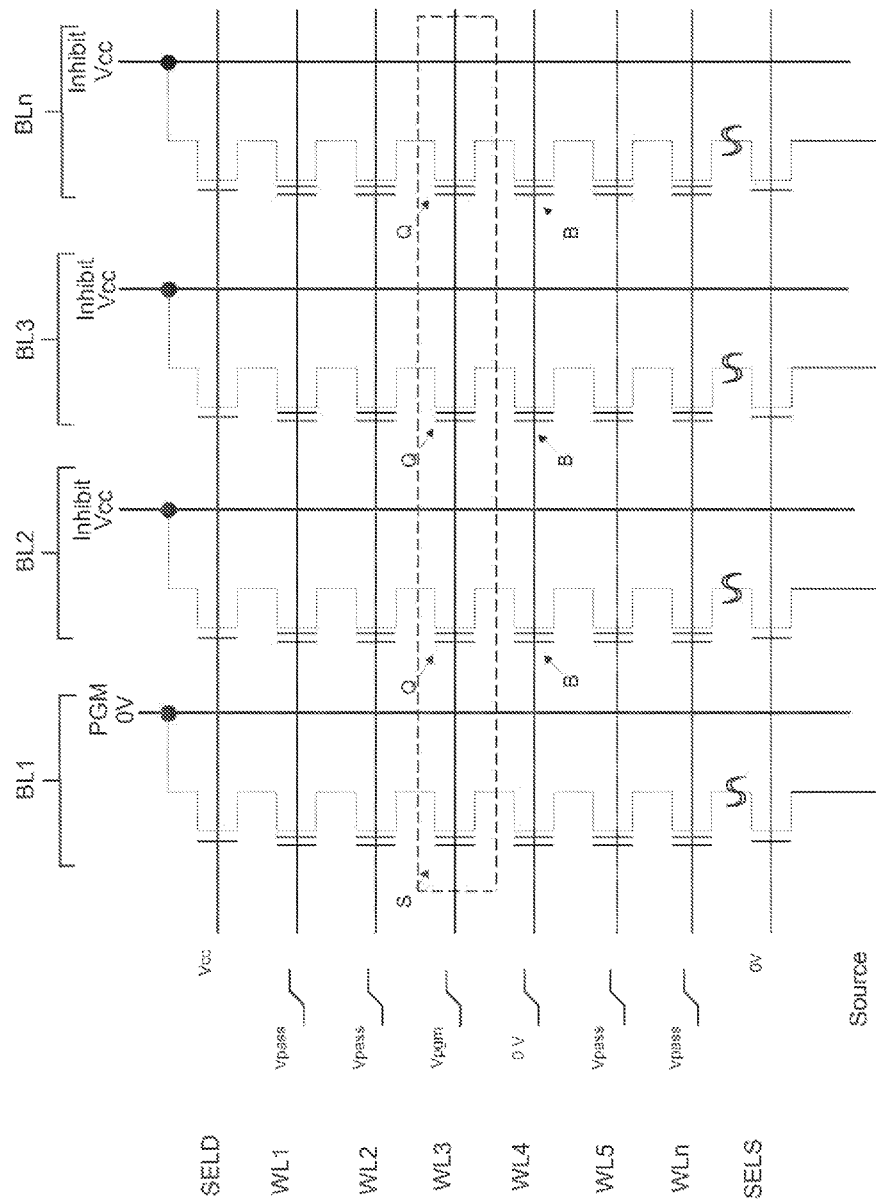
FIG. 7 is a schematic diagram of a NAND flash memory system.
Figure 8:
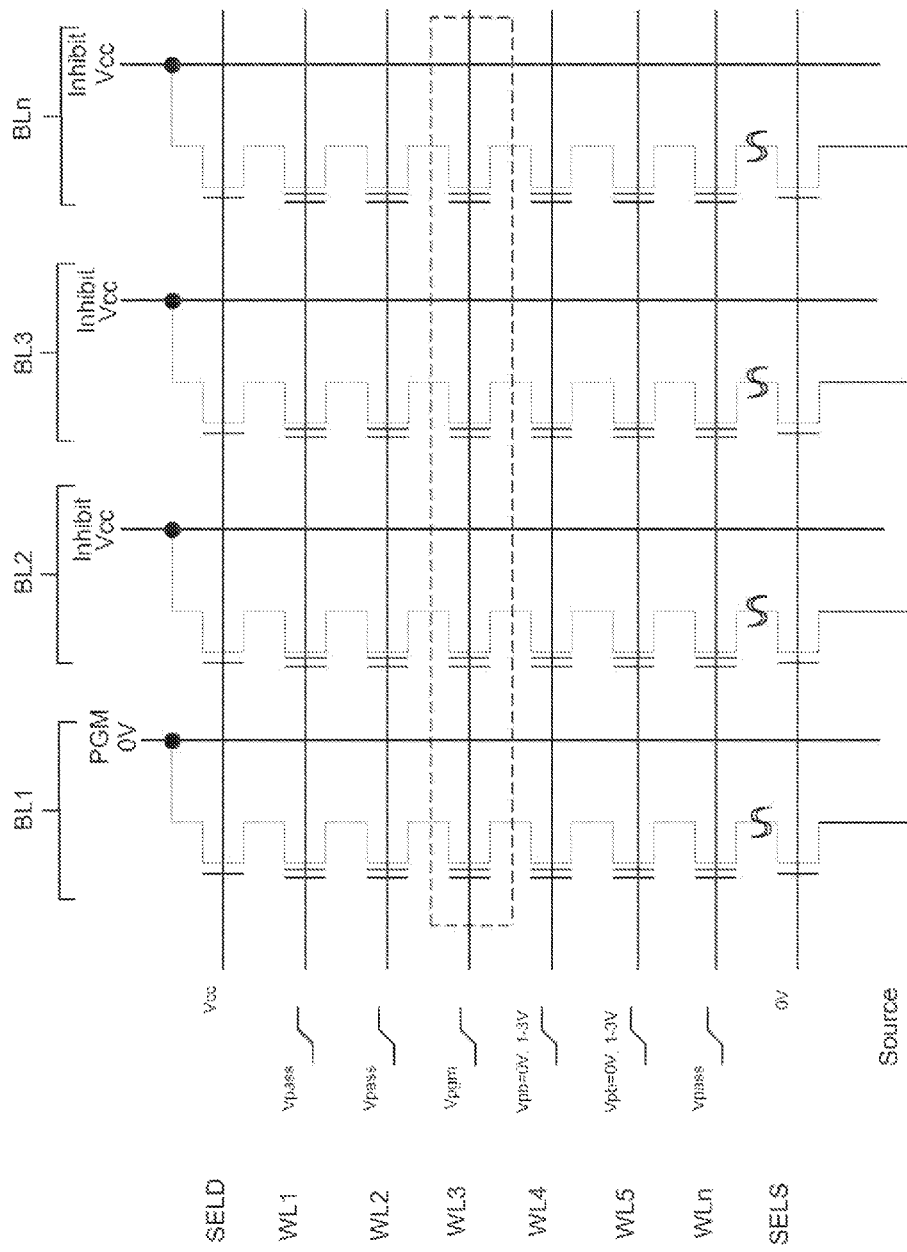
FIG. 8 is a schematic diagram of a NAND flash memory system.
Figure 9:
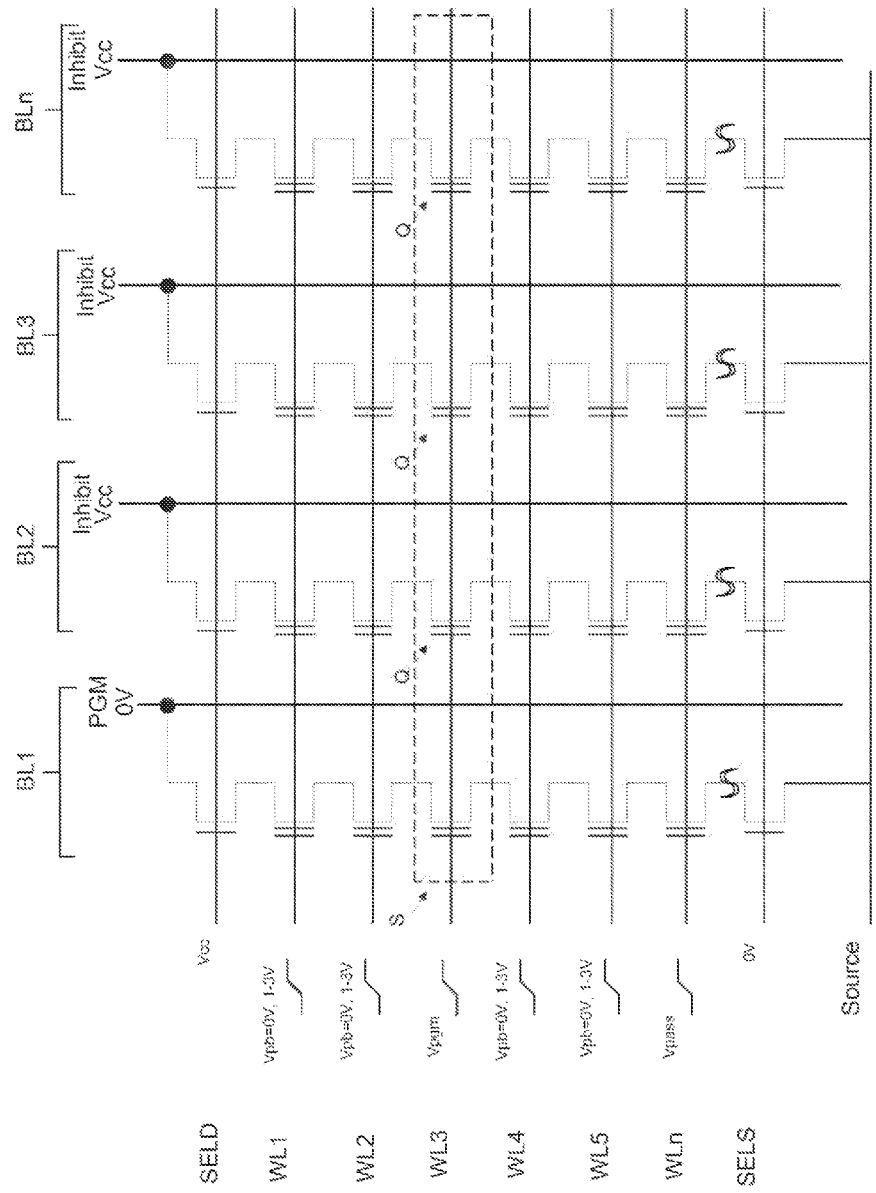
FIG. 9 is a schematic diagram of a NAND flash memory system.
Figure 10:
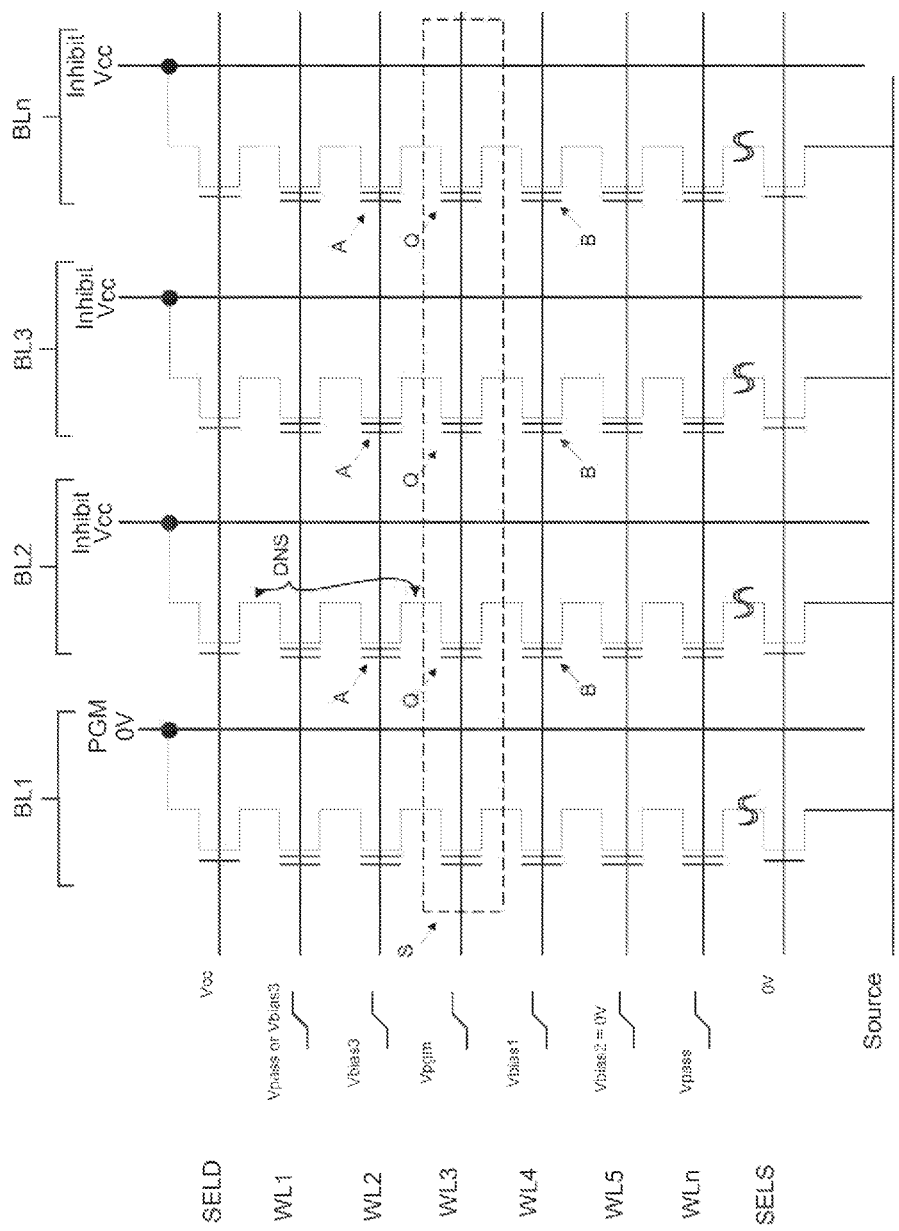
FIG. 10 is a schematic diagram of a NAND flash memory system according to the present invention.
Figure 11:
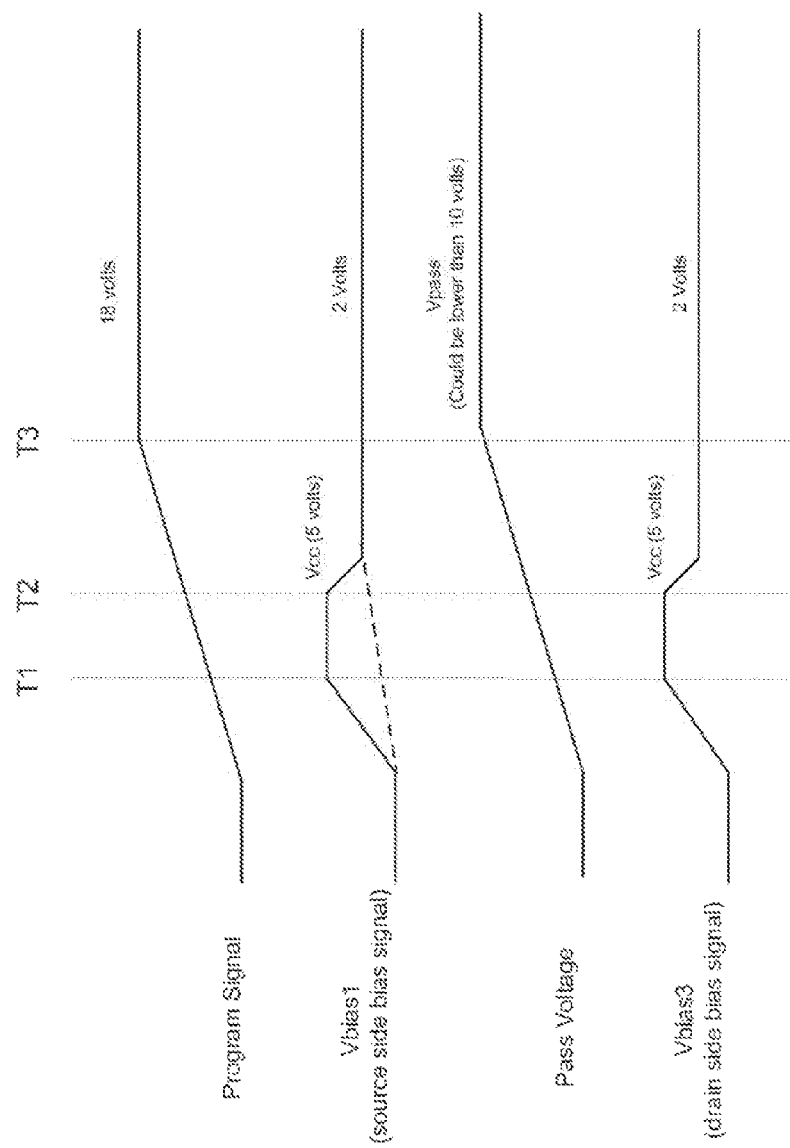
FIG. 11 is a graphical representation of a NAND flash memory programming technique according to the present invention.

In a first embodiment as illustrated in FIGS. 10 and 11, the present invention may be applied to the conventional memory cell array that uses NAND strings and word lines, wherein the word lines are attached to one memory cell from each NAND string in the row. As with conventional LSB, the selected word line WL3 has a program signal Vpgm (e.g. 18-20 V) applied to it, while bias voltages are applied to all of the remaining word lines. Two adjacent word lines WL4, WL5 nearest to the selected word line WL3 on the source side are biased according to the following invention. The word line WL2 adjacent to the selected word line WL3 on the drain side is also biased according to the following invention.

The word line WL4 on the source side, adjacent to the selected word line WL3 has a bias voltage Vbias1 that begins to charge to a predetermined voltage level (e.g. 2 V). Optionally, the bias voltage Vbias1 applied to the word line WL4 may be elevated to a voltage supply level (e.g. 3-5 V) for a predetermined period of time and then reduced to a predetermined voltage level, such as the previously mentioned 2 volts. The second word line WL5 of the adjacent pair on the source side is set to ground. The drain side word line WL2 has a bias voltage Vbias3 that is elevated to the voltage supply level (e.g. 3-5 V) for a predetermined period of time and then similarly reduced to a predetermined voltage level, such as the previously mentioned 2 volts. The drain side word line WL2 voltage is elevated to a level sufficient to pass pre-charge voltage to the memory cell channels of the inhibited bit lines BL2-BLn (channel voltage) and then the voltage is reduced to a level allowing the drain side memory cells to be "shut off."

Optionally, the pre-charging bias voltages Vbias1 and Vbias3 may rise to a voltage supply level Vcc by a time T1 and remain at the voltage supply level Vcc until a time T2 where the bias voltages Vbias1 and Vbias3 reduce to 2V before a time T3. The programming phase will begin after the time T3.

After the pre-charging bias phase, a pass voltage Vpass (possibly lower than 10 V) would then be applied to all other drain side word lines (not shown) as well as the remaining source side word lines WL6-WLn. After the pre-charging bias signals are reduced to the exemplary 2 V, the program signal Vpgm could then be applied to the selected word line WL3.

This bias signal application is not limited to just the adjacent word lines WL2, WL4 on either side of the selected word line WL3. The bias signal may be applied to other word lines (such as WL1) on the drain side and their memory cells, to further reduce current leakage and program disturb. In other words, an n number of drain side word lines can be selected to apply a bias voltage to, rather than just the adjacent word line WL2. For instance, other than just isolating memory cells A and B, the memory cells on the non-selected word line WL1 may also be isolated. A higher n (e.g., a larger number of drain side word lines) reduces the impact current leakage has on program disturb. However, as n gets bigger, the local boosting value is also reduced.

Figure 12:
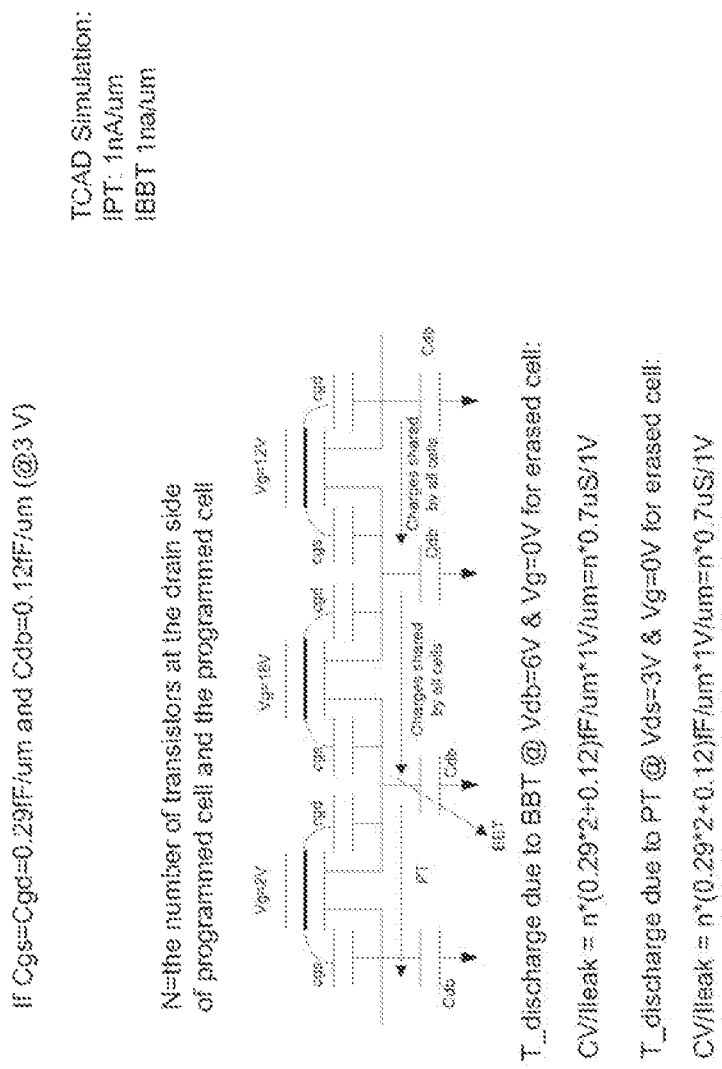
FIG. 12 is a schematic diagram of a portion of a NAND flash memory system according to the present invention.

Current leakage is related to the capacitance found in the memory cells. A lower capacitance leads to higher leakage rates and higher capacitance leads to reduced leakage rates. Discharge values due to channel leakage and junction leakage as seen in FIG. 12 are quantified as:

$$CV/Ileak = n*(0.29*2+0.12)fF/um*1V/1\ nA/um = n*0.7\ uS/1V$$

where $Cgs = Cgd = 0.29$ fF/um and $Cdb = 0.12$ fF/um(@3V). In a TCAD simulation, IPT was 1 nA/um and IBBT was 1 nA/um. As can be seen, as n increases, current leakage has less of an impact on program disturb.

With pre-charging according this embodiment of the invention, the channel voltage can be increased by more than 2 volts if the source side adjacent memory cell B has been erased (worse case). This ensures that the inhibited memory cell B on the source side of the selected word line WL3 will be able to "turn off" even if it had been erased in a previous programming operation. As mentioned previously, if erased, the memory cell B would have a positive charge on its floating gate and a negative threshold, making the pre-charging necessary to ensure the memory cell B can be "shut off" and remain in an EASB scheme and not LSB with its inherent program disturb disadvantages.

In a second embodiment as illustrated in FIGS. 10 and 13, the present invention may be applied to the conventional memory cell array that uses NAND strings and word lines, wherein the word lines are attached to one memory cell from each NAND string in the row. While similar to the previously described embodiment, in this second embodiment, the voltage Vbias3 applied to the drain side word line WL2 is set to a predetermined voltage (e.g. 3-6 V). For this embodiment, the drain side pre-charging bias voltage will be 6 V.

A pre-charging bias voltage Vbias1 at a first predetermined voltage (e.g. 2 V) is applied to the source side word line WL4 adjacent to the selected word line WL3. Optionally, the bias voltage Vbias1 on the same word line WL4 may be elevated to a voltage supply level Vcc (3-5 V) for a predetermined period of time and then reduced to a second predetermined voltage level, such as the previously mentioned 2 volts. Meanwhile, the second source side word line WL5 is still set to ground.

Optionally, the pre-charging bias voltage Vbias1 may rise to a voltage supply level Vcc by a time T1 and remain at the voltage supply level Vcc until a time T2 where the bias voltage Vbias1 reduces to 2V before a time T3. It is only after the time T3 that the programming phase will begin.

After all bias voltages have reached the exemplary 2 volts, a program signal Vpgm (e.g. 18 V) is applied to the selected word line WL3 and a pass voltage Vpass (e.g. 8-12) is applied to all the other word lines that do not have a bias voltage applied according to this invention. In this embodiment of the invention, the pass voltage is an exemplary 12 V.

The result is a drain side voltage high enough to pass pre-charge voltage to the memory cell channels DNS of the inhibited bit lines BL2-BLn. The drain side voltage isolates the inhibited memory cells Q from the other memory cells when its drain voltage goes higher than 6V-Vtb (where Vtb is the channel voltage) and the drain side voltage is kept at that voltage (if there's a leak and the drain voltage drops, the inhibited memory cells Q will draw additional charge from the drain side memory cells A.

As in the previously described embodiment, the isolated channel is not limited to only the two adjacent word lines on either side of the selected word line. An n number of drain side word lines can be isolated. This n is determined by the current leakage criteria, as explained above. The more memory cells that are on the drain side, the less of an impact that current leakage has to program disturbs. However, with a larger number of drain side memory cells, the local boosting value is lower.

This invention also anticipates improved boosting efficiency. Increasing the inhibited memory cell's channel voltage through the use of the pre-charging bias voltages acts to improve boost efficiency and thereby allow lower pass voltages and achieve a reduced risk of programming errors from inadvertently changing threshold voltage values.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method comprising:
   for duration of a time period, increasing a voltage level of a program signal coupled to a selected word line which is coupled to a memory transistor to be programmed;
   increasing a voltage level of a bias signal coupled to a first word line adjacent to a drain side of the selected word line, the voltage level of the bias signal being increased to a first predetermined voltage level at a first point of time during the time period;
   during the time period, increasing a voltage level of a second bias signal coupled to a second word line adjacent to a source side of the selected word line;
   applying a third bias signal to a third word line adjacent to the second word line on the source side of the selected word line; and
   lowering the voltage level of the bias signal to a second predetermined voltage level before a second point of time during the time period.

2. The method of claim 1, further comprising:
   during the time period, increasing the voltage level of the bias signal coupled to a fourth word line adjacent to the first word line on the drain side of the selected word line.

3. The method of claim 1, wherein the voltage level of the second bias signal increases to a third predetermined voltage level at the first point of time.

4. The method of claim 1, wherein the voltage level of the bias signal is lowered to the second predetermined voltage level during the time period.

5. The method of claim 1, wherein the third bias signal is set to ground.

6. The method of claim 1, further comprising:
   during the time period, increasing a voltage level of a pass signal to a plurality of word lines, wherein the plurality of word lines excludes the selected word line and the first word line.

7. A method comprising:
   for duration of a time period, increasing a voltage level of a program signal coupled to a selected word line which is coupled to a memory transistor to be programmed;
   increasing a voltage level of a bias signal coupled to a first word line adjacent to a drain side of the selected word line, the voltage level of the bias signal being increased to a first predetermined voltage level during the time period;
   during the time period, increasing the voltage level of the bias signal coupled to a second word line adjacent to the first word line on the drain side of the selected word line; and
   during the time period, increasing a voltage level of a pass signal coupled to a plurality of word lines, wherein the plurality of word lines excludes the selected word line, the first word line, and the second word line;
   wherein the voltage level of the program signal is a program voltage level at an end of the time period.

8. The method of claim 7, further comprising:
   during the time period, increasing a voltage level of a second bias signal coupled to a fourth word line adjacent to a source side of the selected word line; and
   applying a third bias signal to a third word line adjacent to the fourth word line on the source side of the selected word line.

9. The method of claim 8, wherein the voltage level of the second bias signal is increased to a second predetermined voltage during the time period, further comprising:
   lowering the voltage level of the second bias signal to a third predetermined voltage level during the time period.

10. The method of claim 9, wherein the second predetermined voltage level is 5 volts.

11. The method of claim 9, wherein the third predetermined voltage level is 2 volts.

12. The method of claim 7, wherein the first predetermined voltage level is 3 to 6 volts, and wherein the voltage level of the pass signal is 12 volts.

13. A memory system comprising:
    a plurality of strings of memory transistors, each string forming a bit line arranged in parallel to form an array with a plurality of word lines, each word line coupled across the bit lines to one of the memory transistors in each of the bit lines in the array;
    a processor operable to, for duration of a time period, increase a voltage level of a program signal coupled to a selected word line which is coupled to a memory transistor to be programmed, the processor further operable to increase a voltage level of a bias signal coupled to a first word line adjacent to a drain side of the selected word line, the voltage level of the bias signal being increased to a first predetermined voltage level during the time period; and
    during the time period, increase a voltage level of a second bias signal coupled to a second word line adjacent to a source side of the selected word line;
    wherein the second bias signal is increased to a second predetermined voltage level during the time period, wherein the processor is further operable to lower the voltage level of the second bias signal to a third predetermined voltage level during the time period;
    wherein the processor is further operable to, during the time period, apply a third bias signal to a third word line adjacent to the second word line on the source side of the selected word line.

14. The memory system of claim 13, wherein the processor is further operable to lower the voltage level of the bias signal to a fourth predetermined voltage level during the time period.

15. The memory system of claim 14, wherein the second predetermined voltage level is 5 volts, and wherein the first predetermined voltage level is 3 to 6 volts.

16. The memory system of claim 14, wherein the third predetermined voltage level is 2 volts, and wherein the fourth predetermined voltage level is 2 volts.

* * * * *